US012660708B2

(12) United States Patent
Huh et al.

(10) Patent No.:    US 12,660,708 B2
(45) Date of Patent:        Jun. 16, 2026

(54) METHOD, APPARATUS, AND SYSTEM WITH INTEGRATED CIRCUIT MANUFACTURING

(71) Applicant: Samsung Electronics Co., Ltd., Suwon-si (KR)

(72) Inventors: Yeunhee Huh, Suwon-si (KR); Chisung Bae, Suwon-si (KR)

(73) Assignee: Samsung Electronics Co., Ltd., Suwon-si (KR)

( * ) Notice:    Subject to any disclaimer, the term of this patent is extended or adjusted under 35 U.S.C. 154(b) by 419 days.

(21) Appl. No.: 18/328,848

(22) Filed:    Jun. 5, 2023

(65)              Prior Publication Data

US 2024/0213220 A1      Jun. 27, 2024

(30)        Foreign Application Priority Data

Dec. 23, 2022    (KR) ........................ 10-2022-0182826

(51) Int. Cl.
*H10W 90/00*          (2026.01)
*H10W 72/00*          (2026.01)

(52) U.S. Cl.
CPC .......... *H10W 90/00* (2026.01); *H10W 72/823* (2026.01); *H10W 90/792* (2026.01)

(58) Field of Classification Search
CPC . H10W 90/00; H10W 72/823; H10W 90/792; H01L 24/08
See application file for complete search history.

(56)              References Cited

U.S. PATENT DOCUMENTS

| | | | | |
|---|---|---|---|---|
| 7,095,091 B2 * | 8/2006 | Wu | .................... | H01L 23/49541 |
| | | | | 257/E25.013 |
| 9,536,805 B2 * | 1/2017 | Fazelpour | ............... | H01L 23/36 |
| 9,824,954 B2 * | 11/2017 | Kamiya | ................ | H01L 23/481 |
| 10,453,541 B1 * | 10/2019 | Rowley | .................... | G06F 1/28 |
| 10,978,377 B2 * | 4/2021 | Wang | .................... | H01L 23/481 |
| 11,316,284 B2 * | 4/2022 | Cho | ...................... | H01Q 1/2283 |
| 11,320,497 B2 * | 5/2022 | Hammerschmidt | ... | G01R 33/02 |
| 11,537,154 B2 * | 12/2022 | Lee | ...................... | H02M 1/0045 |
| 11,847,282 B2 * | 12/2023 | Jo | .......................... | G06F 1/1626 |
| 11,855,124 B2 * | 12/2023 | Zou | ...................... | H01L 23/5385 |
| 12,072,748 B2 * | 8/2024 | Zhou | .................... | G06F 9/44505 |

(Continued)

FOREIGN PATENT DOCUMENTS

| | | | | | |
|---|---|---|---|---|---|
| CN | 103378076 B | * | 6/2016 | ......... | H01L 25/0657 |
| CN | 111696983 A | * | 9/2020 | ............. | H10D 84/00 |

(Continued)

*Primary Examiner* — Laura M Menz
(74) *Attorney, Agent, or Firm* — NSIP Law

(57)              ABSTRACT

An integrated circuit (IC) system including a first substrate comprising passive components, a first power managing IC chip including a first power managing IC stacked on the first substrate, first IC chip group including a IC stacked on top of the first power managing IC chip, a control IC chip, stacked on top of the first IC group, including a control IC configured to control the first IC and a second IC of a second IC chip group, the second IC chip group including the second IC stacked on top of the control IC chip, a second power managing IC chip including a second power managing IC stacked on top of the second IC chip group, and a second substrate comprising passive components stacked on top of the second power managing IC chip.

17 Claims, 10 Drawing Sheets

(56) References Cited

U.S. PATENT DOCUMENTS

| | | | | |
|---|---|---|---|---|
| 12,074,514 | B2 * | 8/2024 | Radhakrishnan | H02M 3/07 |
| 12,289,898 | B2 * | 4/2025 | Zou | H01L 23/5227 |
| 2013/0283005 | A1 * | 10/2013 | Emma | H01L 25/0657 |
| | | | | 712/12 |
| 2014/0048948 | A1 * | 2/2014 | Lee | H01L 23/481 |
| | | | | 257/774 |
| 2014/0175667 | A1 * | 6/2014 | Lee | H01L 23/481 |
| | | | | 257/774 |
| 2014/0332930 | A1 * | 11/2014 | Kamiya | H01L 23/481 |
| | | | | 257/621 |
| 2016/0005715 | A1 * | 1/2016 | Fazelpour | H01L 23/5385 |
| | | | | 257/713 |
| 2017/0098469 | A1 * | 4/2017 | Park | G11C 29/028 |
| 2017/0236809 | A1 * | 8/2017 | Trimberger | H01L 25/18 |
| | | | | 257/777 |
| 2017/0301625 | A1 * | 10/2017 | Mahajan | H01L 23/5381 |
| 2018/0166420 | A1 * | 6/2018 | Park | H01L 25/0657 |
| 2019/0043538 | A1 * | 2/2019 | Hollis | H02M 3/156 |
| 2019/0287575 | A1 * | 9/2019 | Hollis | G11C 5/147 |
| 2019/0287943 | A1 * | 9/2019 | Wang | H01L 24/19 |
| 2019/0317911 | A1 * | 10/2019 | Chun | G06F 1/3237 |
| 2020/0211930 | A1 * | 7/2020 | Wang | H01L 23/481 |
| 2021/0111486 | A1 * | 4/2021 | Tamrakar | H01Q 9/42 |
| 2021/0135378 | A1 * | 5/2021 | Cho | H01Q 1/2283 |
| 2021/0143525 | A1 * | 5/2021 | Kim | H01Q 9/0407 |
| 2022/0094256 | A1 * | 3/2022 | Radhakrishnan | H02M 3/07 |
| 2022/0157236 | A1 * | 5/2022 | Feng | G09G 3/3233 |
| 2022/0179437 | A1 * | 6/2022 | Lee | H02M 3/04 |
| 2022/0183172 | A1 * | 6/2022 | Shim | H01Q 25/005 |
| 2023/0079493 | A1 * | 3/2023 | Jo | G06F 3/0383 |
| | | | | 345/174 |
| 2023/0101002 | A1 * | 3/2023 | Toyota | H01L 25/0652 |
| | | | | 257/690 |
| 2023/0154913 | A1 * | 5/2023 | Tsai | H01L 25/50 |
| | | | | 438/666 |
| 2023/0230955 | A1 * | 7/2023 | Huh | H01L 25/50 |
| | | | | 257/668 |
| 2023/0268244 | A1 * | 8/2023 | Ong | H01L 21/4857 |
| | | | | 257/712 |
| 2023/0387181 | A1 * | 11/2023 | Zou | H01L 25/0657 |
| 2024/0055336 | A1 * | 2/2024 | Lin | H01L 25/18 |
| 2024/0056082 | A1 * | 2/2024 | Lin | H01L 25/071 |
| 2024/0105467 | A1 * | 3/2024 | Jung | H01L 21/4853 |
| 2024/0105762 | A1 * | 3/2024 | Zou | H01L 25/0657 |
| 2024/0213220 | A1 * | 6/2024 | Huh | H01L 25/0657 |
| 2024/0231459 | A1 * | 7/2024 | Kariya | G06F 1/26 |
| 2024/0387345 | A1 * | 11/2024 | Sadineni | H05K 1/0233 |
| 2024/0387502 | A1 * | 11/2024 | Tsai | H01L 25/50 |
| 2025/0046700 | A1 * | 2/2025 | Chou | H01L 23/49816 |
| 2025/0096098 | A1 * | 3/2025 | Yim | H01L 23/481 |
| 2025/0125273 | A1 * | 4/2025 | Lin | H01L 24/05 |
| 2025/0201798 | A1 * | 6/2025 | Hsiao | H01L 25/50 |
| 2025/0285658 | A1 * | 9/2025 | Li | G11C 5/04 |
| 2025/0349819 | A1 * | 11/2025 | Tsai | H01L 25/50 |

FOREIGN PATENT DOCUMENTS

| | | | | | |
|---|---|---|---|---|---|
| CN | 114613746 | A | * | 6/2022 | G06F 1/26 |
| CN | 115968463 | A | * | 4/2023 | G06F 3/0442 |
| CN | 219917149 | U | * | 10/2023 | |
| CN | 118102712 | A | * | 5/2024 | H01L 25/18 |
| CN | 118824196 | A | * | 10/2024 | B60R 11/0235 |
| CN | 119498038 | A | * | 2/2025 | H10H 29/142 |
| CN | 120237135 | A | * | 7/2025 | H01L 21/56 |
| CN | 120565541 | A | * | 8/2025 | H01L 21/56 |
| DE | 102021123079 | A1 | * | 6/2022 | G06F 1/26 |
| DE | 102023104867 | A1 | * | 10/2023 | H02M 3/33592 |
| EP | 1587141 | A2 | * | 10/2005 | H01L 23/48 |
| EP | 4137921 | A1 | * | 2/2023 | G06F 3/016 |
| EP | 4231351 | A1 | * | 8/2023 | H10D 1/716 |
| EP | 4137921 | B1 | * | 7/2025 | H01Q 21/08 |
| JP | H06291250 | A | * | 10/1994 | |
| JP | 2859429 | B2 | * | 2/1999 | H01L 25/105 |
| JP | 2000243902 | A | * | 9/2000 | |
| JP | 3429943 | B2 | * | 7/2003 | |
| KR | 20080083533 | A | * | 9/2008 | H01L 24/10 |
| KR | 10-2011-0118948 | A | | 11/2011 | |
| KR | 10-2013-0024317 | A | | 3/2013 | |
| KR | 101352814 | B1 | * | 1/2014 | H01L 23/48 |
| KR | 10-2018-0067973 | A | | 6/2018 | |
| KR | 20180138242 | A | * | 12/2018 | H01L 23/50 |
| KR | 101964403 | B1 | * | 8/2019 | G11C 5/14 |
| KR | 20210051472 | A | * | 5/2021 | H04M 1/0277 |
| KR | 20210142894 | A | * | 11/2021 | G06F 3/016 |
| KR | 20220008618 | A | * | 1/2022 | H04N 23/45 |
| KR | 20220033636 | A | * | 3/2022 | H01L 23/49822 |
| KR | 20240040025 | A | * | 3/2024 | H01L 23/49811 |
| KR | 20240056082 | A | * | 4/2024 | G06N 3/0464 |
| KR | 102663550 | B1 | * | 5/2024 | H04M 1/0249 |
| KR | 20240100806 | A | * | 7/2024 | H01L 25/18 |
| KR | 20240178254 | A | * | 12/2024 | H10H 29/142 |
| KR | 102858175 | B1 | * | 9/2025 | G06N 3/0464 |
| KR | 102863884 | B1 | * | 9/2025 | H01Q 21/08 |
| TW | 202224510 | A | * | 6/2022 | G06F 1/26 |
| WO | WO-2017142637 | A1 | * | 8/2017 | H01L 25/16 |
| WO | WO-2019027805 | A1 | * | 2/2019 | G11C 11/4074 |
| WO | WO-2021085860 | A1 | * | 5/2021 | H01Q 21/062 |
| WO | WO-2021235680 | A1 | * | 11/2021 | G06F 3/016 |
| WO | WO-2022055598 | A1 | * | 3/2022 | H01L 25/50 |
| WO | WO-2022067120 | A1 | * | 3/2022 | G06F 1/28 |
| WO | WO-2022119368 | A1 | * | 6/2022 | G06F 1/1635 |
| WO | WO-2023076842 | A1 | * | 5/2023 | H01L 25/50 |
| WO | WO-2024113802 | A1 | * | 6/2024 | H01L 25/18 |
| WO | WO-2024259567 | A1 | * | 12/2024 | H10H 29/142 |
| WO | WO-2025140395 | A1 | * | 7/2025 | H01L 21/56 |
| WO | WO-2025151196 | A1 | * | 7/2025 | H01L 25/50 |
| WO | WO-2025246303 | A1 | * | 12/2025 | H01L 23/31 |

* cited by examiner

100

PMIC Passive Components 160

PMIC 150

IC 132-2

IC 132-1          } 130-2

CTRL_IC 140

IC 131-2

IC 131-1          } 130-1

PMIC 120

PMIC Passive Components 110

700

METHOD, APPARATUS, AND SYSTEM WITH INTEGRATED CIRCUIT MANUFACTURING

CROSS-REFERENCE TO RELATED APPLICATIONS

This application claims the benefit under 35 USC § 119(a) of Korean Patent Application No. 10-2022-0182826, filed on Dec. 23, 2022, in the Korean Intellectual Property Office, the entire disclosure of which is incorporated herein by reference for all purposes.

BACKGROUND

1. Field

The following description relates to a system, method, and apparatus with integrated circuit (IC) manufacturing.

2. Description of Related Art

Three-dimensional (3D) integrated circuits (ICs) capable of high-speed/wide-band input/output (I/O) transmission with small sizes and weight have been used.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, here is an integrated circuit (IC) system including a first substrate including passive components, a first power managing IC chip including a first power managing IC stacked on the first substrate, first IC chip group, including a IC, stacked on top of the first power managing IC chip, a control IC chip, stacked on top of the first IC group, including a control IC configured to control the first IC and a second IC of a second IC chip group, the second IC chip group, including the second IC, stacked on top of the control IC chip, a second power managing IC chip including a second power managing IC stacked on top of the second IC chip group, and a second substrate including passive components stacked on top of the second power managing IC chip.

In a general aspect, the first IC chip group including the first IC may include a first IC chip and a second IC chip stacked on top of the first IC chip and the second IC chip group including the second IC may include a third IC chip and a fourth IC chip stacked on top of the third IC chip.

The second IC chip may be stacked on the first IC chip such that second components of the second IC chip, identical to first components of the first IC chip, are in a relative positional relationship corresponding to an arrangement of the first components but rotated, in a same lateral plane, about a center of the first IC chip by a first preset angle.

The third IC chip may be stacked above the first IC chip such that third components of the third IC chip, identical to first components of the first IC chip, are in a relative positional relationship corresponding to an arrangement of the first components but rotated, in a same lateral plane, counterclockwise about a center of the first IC chip by a second preset angle.

The fourth IC chip may be stacked above the first IC chip such that fourth components of the fourth IC chip, identical to first components of the first IC chip, are in a relative positional relationship corresponding to an arrangement of the first components but rotated, in a same lateral plane, clockwise about a center of the first IC chip by a second preset angle.

The second power managing IC chip may be stacked on top of the second IC chip group is arranged such that fifth components of the second power managing IC, identical to components of the first power managing IC of the first power managing IC chip, are in a relative positional relationship corresponding to an arrangement of the components of the first power managing IC but rotated, in a same lateral plane, counterclockwise about a center of the first power managing IC chip by a second preset angle.

The third IC chip may be stacked above the first IC chip, having an upside arrangement, such that third components of the third IC chip, identical to first components of the first IC chip, are in a relative positional arrangement corresponding to an arrangement of the first components but rotated, in a same lateral plane, counterclockwise about a center of the first IC unit chip by a second preset angle, and then rotationally flipped upside-down, from left to right, about a center of the third IC chip relative to the upside arrangement of the first IC chip.

The fourth IC chip may be stacked above the first IC chip, having an upside arrangement, such that fourth components of the fourth IC chip, identical to first components of the first IC chip, are in a relative positional arrangement corresponding to an arrangement of the first components but rotated, in a same lateral plane, clockwise about a center of the first IC chip by a second preset angle, and then rotationally flipped upside-down, from left to right, about a center of the fourth IC chip relative to the upside arrangement of the first IC chip.

The second power managing IC chip may be stacked above the first power managing IC chip, having an upside arrangement, and arranged such that sixth components of the second power managing IC, identical to components of the first power managing IC of the first power managing IC chip, are in a relative positional arrangement corresponding to an arrangement of the components of the first power managing IC but rotated, in a same lateral plane, counterclockwise about a center of the first power managing IC chip by a second preset angle, and then rotationally flipped upside-down, from left to right, about a center of the second power managing IC chip relative to the upside arrangement of the first power managing IC chip.

The third IC chip may be stacked above the first IC chip, having an upside arrangement, such that third components of the third IC chip, identical to first components of the first IC chip, are in a relative positional arrangement corresponding to an arrangement of the first components but rotationally flipped upside-down, from left to right, about a center of the third IC chip relative to the upside arrangement of the first IC chip.

The second power managing IC chip may be stacked above the first power managing IC chip, having an upside arrangement, such that fifth components of the second power managing IC chip, identical to components of the first power managing IC chip, are in a relative positional arrangement corresponding to an arrangement of the components but rotationally flipped upside-down, from left to right, about a center of the second power managing IC chip relative to the upside arrangement of the first power managing IC chip.

The first power managing IC chip may include a plurality of interconnects to the second IC chip group.

The second power managing IC chip may be stacked above the first power managing IC chip, having an upside arrangement, such that fifth components of the second power managing IC chip, identical to first components of the first power managing IC chip, are in a relative positional arrangement corresponding to an arrangement of the first components but rotationally flipped upside-down, from left to right, about a center of the second power managing IC chip relative to the upside arrangement of the first power managing IC chip.

The fourth IC chip may be stacked above the first IC chip, having an upside arrangement, such that fourth components of the fourth IC chip, identical to first components of the first IC chip, are in a relative positional arrangement corresponding to an arrangement of the first components but rotationally flipped upside down, right to left, about a center of the fourth IC chip, and then rotated, in a same lateral plane, by a first preset angle, about a center of the fourth IC chip.

The first power managing IC chip may include a plurality of interconnects to the second IC chip group.

The first power managing IC chip and the second power managing IC chip may include a plurality of capacitors and a plurality of inductors.

The first power managing IC chip may be different from the second power managing IC chip.

IC chips of the first IC chip group and the second IC chip group may be identical.

The IC system may include a plurality of interconnects configured to electrically connect circuits of the first power managing IC chip, the first IC chip group, the control IC chip, the second IC chip group, and the second power managing IC chip to the first substrate and the second substrate, and a number of the plurality of interconnects is determined based on a total number of IC chips of the first IC chip group and the second IC chip group.

In a general aspect, here is provided a method including stacking a first substrate including passive components, stacking a first power managing IC chip including a first power managing IC stacked on the first substrate, stacking a first IC chip group for a first IC portion stacked on top of the first power managing IC chip, stacking a second IC chip group for a second IC portion stacked on top of a control IC chip, stacking the control IC chip including a control IC configured to control the first IC chip group and the second IC chip group, the control IC chip being stacked on top of the first IC chip group, stacking a second managing IC chip including a second power managing IC stacked on top of the second IC chip group, and stacking a second substrate including passive components on top of the second power managing IC chip.

In a general aspect, here is an integrated circuit (IC) system including a substrate including passive components as a base, a first power managing IC chip, including a first power managing IC, stacked on the first substrate, a first IC chip group including a first IC chip having a stacked upside arrangement, a control IC chip, stacked on the first IC chip group, including a control IC configured to control the first IC chip group and a second IC chip group, and the second IC chip group, stacked on the control IC chip, includes a second IC unit, wherein the second IC chip is identical to the first IC chip but stacked upside down relative to the stacked upside arrangement of the first IC chip.

The first IC chip group may include a plurality of first IC chips in the stacked upside arrangement over the substrate, the plurality of first IC chips each may include a connection to a power transmission through-silicon via (TSV), connection to a central signal TSV, and connection to an independent signal TSV, and the second IC chip group may include a plurality of second IC chips in the stacked upside-down arrangement, wherein the plurality of second IC chips each may include a connection to a power transmission TSV, connection to a central signal TSV, and connection to an independent signal TSV.

Other features and aspects will be apparent from the following detailed description, the drawings, and the claims.

Figure 1:
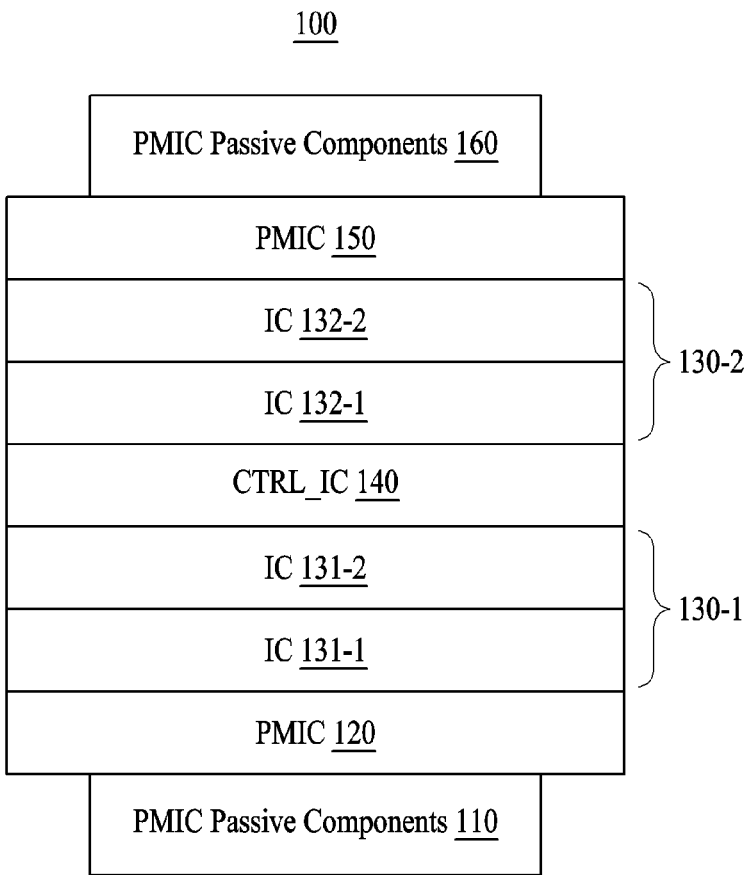
FIG. 1 illustrates an example integrated circuit (IC) system according to one or more embodiments.

Throughout the drawings and the detailed description, unless otherwise described or provided, it may be understood that the same, or like, drawing reference numerals refer to the same, or like, elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences within and/or of operations described herein are merely examples, and are not limited to those set forth herein, but may be changed as will be apparent after an understanding of the disclosure of this application, except for sequences within and/or of operations necessarily occurring in a certain order. As another example, the sequences of and/or within operations may be performed in parallel, except for at least a portion of sequences of and/or within operations necessarily occurring in an order, e.g., a certain order. Also, descriptions of features that are known after an understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application. The use of the term "may" herein with respect to an example or embodiment, e.g., as to what an example or embodiment may include or implement, means that at least one example or embodiment exists where such a feature is included or implemented, while all examples are not limited thereto.

Throughout the specification, when a component or element is described as being "on", "connected to," "coupled to," or "joined to" another component, element, or layer it may be directly (e.g., in contact with the other component or element) "on", "connected to," "coupled to," or "joined to" the other component, element, or layer or there may reasonably be one or more other components, elements, layers intervening therebetween. When a component or element is described as being "directly on", "directly connected to," "directly coupled to," or "directly joined" to another component or element, there can be no other elements intervening therebetween. Likewise, expressions, for example, "between" and "immediately between" and "adjacent to" and "immediately adjacent to" may also be construed as described in the foregoing.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

Although terms such as "first," "second," and "third", or A, B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the teachings of the examples.

The terminology used herein is for describing various examples only and is not to be used to limit the disclosure. The articles "a," "an," and "the" are intended to include the plural forms as well, unless the context clearly indicates otherwise. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof, or the alternate presence of an alternative stated features, numbers, operations, members, elements, and/or combinations thereof. Additionally, while one embodiment may set forth such terms "comprise" or "comprises," "include" or "includes," and "have" or "has" specify the presence of stated features, numbers, operations, members, elements, and/or combinations thereof, other embodiments may exist where one or more of the stated features, numbers, operations, members, elements, and/or combinations thereof are not present.

As used herein, the term "and/or" includes any one and any combination of any two or more of the associated listed items. The phrases "at least one of A, B, and C", "at least one of A, B, or C", and the like are intended to have disjunctive meanings, and these phrases "at least one of A, B, and C", "at least one of A, B, or C", and the like also include examples where there may be one or more of each of A, B, and/or C (e.g., any combination of one or more of each of A, B, and C), unless the corresponding description and embodiment necessitates such listings (e.g., "at least one of A, B, and C") to be interpreted to have a conjunctive meaning.

Unless otherwise defined, all terms, including technical and scientific terms, used herein have the same meaning as commonly understood by one of ordinary skill in the art to which this disclosure pertains and specifically in the context on an understanding of the disclosure of the present application. Terms, such as those defined in commonly used dictionaries, are to be interpreted as having a meaning that is consistent with their meaning in the context of the relevant art and specifically in the context of the disclosure of the present application, and are not to be interpreted in an idealized or overly formal sense unless expressly so defined herein.

An electronic circuit including a semiconductor chip or a semiconductor chip package that employs a chip stacking technique may experience an improvement in a degree of integration and in its signal transmission characteristics. A bonding wire technique and a through silicon via (TSV) technique may be used as techniques of connecting a plurality of stacked semiconductor chips to each other. Compared to the bonding wire technique, the TSV technique may significantly reduce a wiring distance, making it possible to achieve high-speed, low-power usage, and miniaturized components.

'System on Chip' (SoC) techniques may integrate into one chip various devices (e.g., a power, a processor, an analog signal sensor, etc.) that are typically included in a system using multiple chips improved system performance by reduced parasitic elements between the devices and by reducing a system volume. In examples, the SoC technique may improve the system performance and lower a manufacturing unit price by reducing a chip area.

Techniques of integrating multiple chips (e.g., SoC techniques) may be divided into a two-dimensional (2D) technique of connecting multiple chips through a wafer, a 2.5D technique of depositing an interposer on a wafer and connecting multiple chips through the interposer, and a 3D technique of stacking multiple chips on a substrate. These techniques are different in their respective technological risks, unit price, form factor, and the like. Mobile electronic devices, extended reality (XR) devices, and augmented reality (AR) electronic devices, which account for the largest portion of the electronic device market, may benefit from the value that the 3D technique may provide.

A system on a multi-chip (SoMC) technique related to the 3D technique may be applied to create scalable systems using multiple identical chips. Examples of the scalable systems may include processors, memories, and analog signal sensing (e.g., touch sensing, pressure sensing, image sensing, and neural sensing) systems, as non-limiting examples. These systems may use or require a power managing device (e.g., intellectual property (IP) core), a signal control device (e.g., IP core) in addition to a main device (e.g., IP core) (i.e., a device providing a main function to the SoMC). However, stacking multiple chips using the 3D technique may cause distribution and signal propagation issues and increase system design complexity.

An integrated circuit (IC) system according to various examples of the present disclosure proposes a method that may effectively distribute power and signals in a SoMC. The method may be applied with little or no limitation for a design of a neural recording system that may be built using multiple chips having an identical channel, and accordingly, it may be possible to distribute power and signals with a minimum number of pads and through silicon vias (TSVs). Furthermore, there may be an increase in scalability of a technical field using multiple identical chips such as a complementary metal-oxide-semiconductor (CMOS) image sensor, a bio-signal sensor, a display driving circuit, and a touch sensor.

FIG. 1 illustrates an example integrated circuit (IC) system according to one or more embodiments. The examples may be implemented as various types of products, such as, for example, a personal computer (PC), a laptop computer, a tablet computer, a smartphone, a television (TV), a smart home appliance, an intelligent vehicle, a kiosk, and a wearable device.

Referring to FIG. 1, in a non-limiting example, an IC system 100 may include a first substrate 110 including passive components, a first power managing IC chip 120 including a first power managing IC stacked on the first substrate 110, first IC chip group 130-1 for an IC portion stacked on top of the first power managing IC chip 120, a control IC chip 140 including a control IC that controls an IC portion stacked on top of the first IC chip group 130-1, second IC chip group 130-2 for an IC portion stacked on top of the control IC chip 140, a second power managing IC chip 150 including a second power managing IC stacked on top of the second IC chip group 130-2, and a second substrate 160 including passive components stacked on top of the second power managing IC chip 150. The first IC chip group 130-1 may include one or more IC chips 131-1 and 131-2. The second IC chip group 130-2 may include one or more IC chips 132-1 and 132-2.

The IC system 100 may further include a plurality of interconnects (not shown) that electrically connects circuits included in the first power managing IC chip 120, the first IC chip group 130-1, the control IC chip 140, the second IC chip group 130-2, and the second power managing IC chip 150 to the first substrate 110 and the second substrate 160. In an example, the number of the plurality of interconnects may be determined based on a number of IC chips included in the first IC chip group and the second IC chip group. The plurality of interconnects may include a pad and a TSV. A three-dimensional (3D) TSV IC, which is one of above-mentioned 3D IC technologies, is a chip package that may maximize, or increase, a number of transistors in an area and minimize research and development time and costs by vertically designing and stacking existing 2D planar chips and electrically connecting the chips. Using the 3D TSV IC may allow chips with various functions to be stacked in a single package, and thus, a highly integrated multifunctional system may be implemented. The TSV may have a structure that connects a transistor or connection lines formed on an upper surface of a chip to a lower surface of the chip and may three-dimensionally stack semiconductor chips using a structure such as a through via on a printed board. Since the TSV uses a technique of vertically descending through an interior of a wafer rather than detouring around the outside of the chip, a short or shortest, or small or smallest, distance from the chip to another chip or the printed board may be travelled. The short, shortest, small, or smallest, distance may result in a reduced signal loss, making it possible to operate high-speed and low-power communication between chips and to implement a high-performance 3D IC system in package (SiP). In addition, in an example that uses the TSV for a power line, it may be possible to design a low-power off-chip driver, which may thereby increase an available usage time for example mobile electronic products.

In an example, the first IC chip group 130-1 included in the IC system 100 may include a (1-1)-th IC chip 131-1 and a (1-2)-th IC chip 131-2 stacked on top of the (1-1)-th IC chip 131-1, and the second IC chip group 130-2 may include a (2-1)-th IC chip 132-1 and a (2-2)-th IC chip 132-2 stacked on top of the (2-1)-th IC chip 132-1. However, any number of IC chips may be used in each of the first IC chip group 130-1 and the second chip group 130-2. Each of the IC chips 131-1, 131-2, 132-1, and 132-2 may be arranged after being rotated or flipped, and the IC chips may be arranged such that central signals are able to be transmitted using a minimum, or lower, number of pads and TSVs and that independent signals are able to be transmitted using the minimum number of pads and TSVs so that the independent signals do not overlap regardless of whether the chips are rotated or flipped. The pads and TSVs may not be required to be positioned at the edges of the IC chip. In addition, when a chip is rotated about its center, a relative positional relationship between the pads and TSVs may stay relatively identical. The system 100 may also reduce a heat increase issue and minimize the number of TSVs and pads included in the plurality of interconnects by rotating, flipping and manufacturing, and flipping and stacking each of the IC chips.

The control IC chip 140 included in the IC system 100 may perform an operation of transmitting a central signal or independent signal to the IC chips 131-1, 131-2, 132-1, and 132-2 and may be positioned, for example, in the middle of the IC chips 131-1, 131-2, 132-1, and 132-2. In another example, the control IC chip 140 may be positioned between of the first IC chip group 130-1 and the second IC chip group 130-2, regardless of a respective number of IC chips in either of the first IC chip group 130-1 and the second IC chip group 130-2.

In a non-limiting example, the first power managing IC chip 120 and the second power managing IC chip 150 included in the IC system 100 may have a switched capacitor structure, a switched inductive structure, and a hybrid structure. The hybrid structure may be a combination of switched capacitor and switched inductive structures, that generally require, or use, passive components. The first power managing IC chip 120 may be arranged on a lowermost end of the IC system 100, and the second power managing IC chip 150 may be arranged on an uppermost end of the IC system 100. The first power managing IC chip 120 and the second power managing IC chip 150 included in the IC system 100 may be of a same type or of different types. As shown by the illustration of the IC system 100, it may be possible to minimize a heat increase issue in the overall system and reduce power consumption by arranging the first power managing IC chip 120 and the second power managing IC chip 150 (i.e., chips that require passive components) on the upper and lower ends, arranging the first substrate 110 (also including passive components) as close as possible to the first power managing IC chip 120, and arranging the second substrate 160 (including passive components) as close as possible to the second power managing IC chip 150. Furthermore, this example arrangement may also be able to enhance a voltage accuracy and reduce a design difficulty of the system.

The IC system 100 illustrated in FIG. 1 is merely an example, and examples are not limited to the limited number of unit chips or power management integrated circuits (PMICs) illustrated in FIG. 1.

Figure 2A:
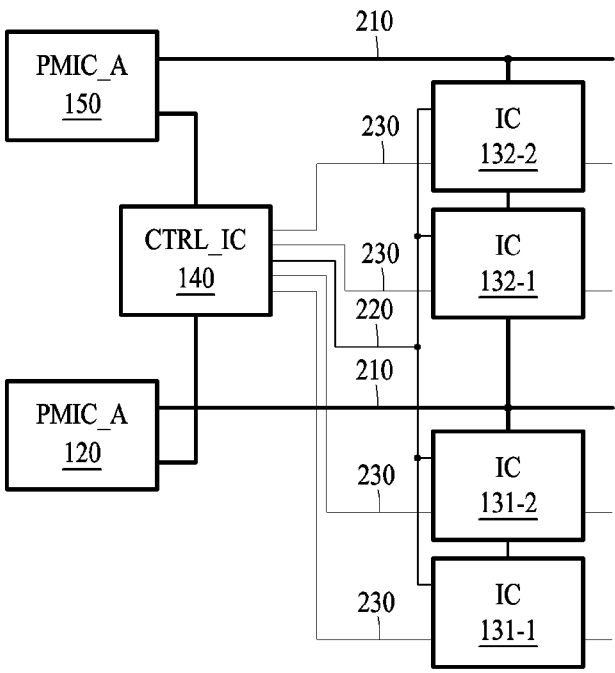
FIGS. 2A-2C illustrate example connection relationships of an IC system according to one or more embodiments.
Figure 2B:
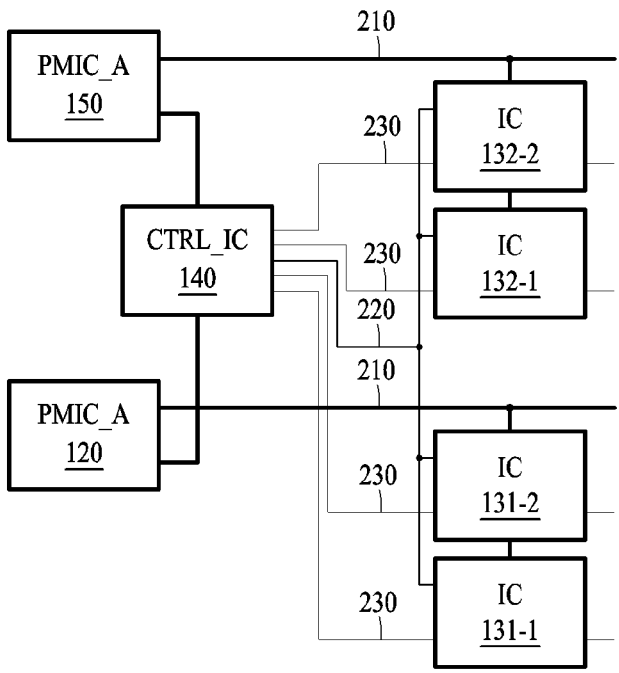
Figure 2C:
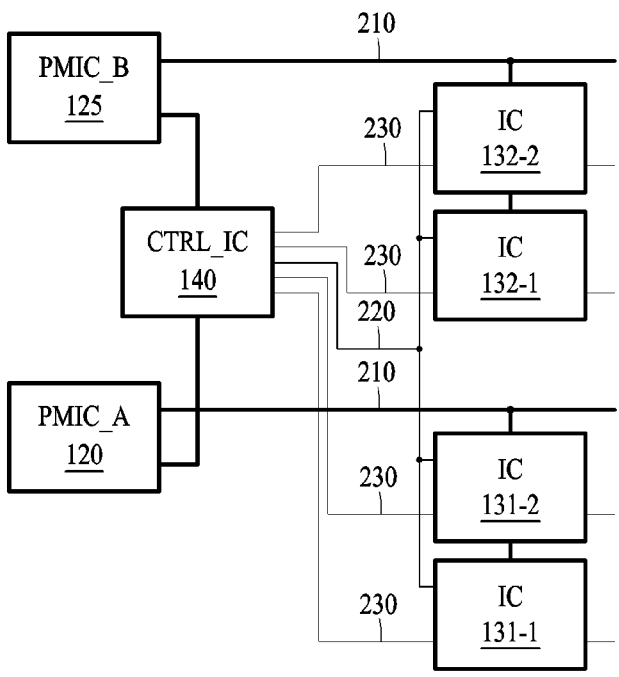

FIGS. 2A-2C illustrate example connection relationships of an IC system according to one or more embodiments.

Referring to FIG. 2A, in a non-limiting example, the first power managing IC chip 120 may transmit power to the IC chips 131-1, 131-2, 132-1, and 132-2 through a power transmission TSV 210. The second power managing IC chip 150 may transmit power to the IC chips 131-1, 131-2, 132-1, and 132-2 through the power transmission TSV 210. The control IC chip 140 may be positioned in the middle of the IC chips 131-1, 131-2, 132-1, and 132-2 and may transmit a central signal to the IC chips 131-1, 131-2, 132-1, and 132-2 through a central signal transmission TSV 220. The control IC chip 140 may be positioned in the middle of the IC chips 131-1, 131-2, 132-1, and 132-2 and may transmit an independent signal to the IC chips 131-1, 131-2, 132-1, and 132-2 through an independent signal transmission TSV 230. As illustrated in FIG. 2A, the first power managing IC chip 120 and the second power managing IC chip 150 may be of same type(i.e., type A), and a system may be connected in a way that transmits the same power to the IC chips 131-1, 131-2, 132-1, and 132-2.

Referring to FIG. 2B, the first power managing IC chip 120 may transmit power to the IC chips 131-1, 131-2, 132-1, and 132-2 through the power transmission TSV 210. The second power managing IC chip 150 may transmit power to the IC chips 131-1, 131-2, 132-1, and 132-2 through the power transmission TSV 210. The control IC chip 140 may be positioned in the middle of the IC chips 131-1, 131-2, 132-1, and 132-2 and may transmit the central signal to the IC chips 131-1, 131-2, 132-1, and 132-2 through the central signal transmission TSV 220. The control IC chip 140 may be positioned in the middle of the IC chips 131-1, 131-2, 132-1, and 132-2 and may transmit the independent signal to the IC chips 131-1, 131-2, 132-1, and 132-2 through the independent signal transmission TSV 230. As illustrated in FIG. 2B, the first power managing IC chip 120 and the second power managing IC chip 150 may be of the same type (i.e., type A), but when power required by the IC chips 131-1 and 131-2 and power required by the IC chips 132-1 and 132-2 are different depending on an embodiment or user selection or a situation in which a user's use of the IC system or underlying electronic apparatus, the system may be connected in a way that is different from the way illustrated in FIG. 2A.

Referring to FIG. 2C, the first power managing IC chip 120 may transmit power to the IC chips 131-1, 131-2, 132-1, and 132-2 through the power transmission TSV 210. A second power managing IC chip 125 may transmit power to the IC chips 131-1, 131-2, 132-1, and 132-2 through the power transmission TSV 210. The control IC chip 140 may be positioned in the middle of the IC chips 131-1, 131-2, 132-1, and 132-2 and may transmit the central signal to the IC chips 131-1, 131-2, 132-1, and 132-2 through the central signal transmission TSV 220. The control IC chip 140 may be positioned in the middle of the IC chips 131-1, 131-2, 132-1, and 132-2 and may transmit the independent signal to the IC chips 131-1, 131-2, 132-1, and 132-2 through the independent signal transmission TSV 230. As illustrated in FIG. 2C, the first power managing IC chip 120 and the second power managing IC chip 125 may be of different types—(i.e., PMIC 120 is type A while PMIC 125 is type B), and when the power required by the IC chips 131-1 and 131-2 and the power required by the IC chips 132-1 and 132-2 are different depending on the situation in which the user uses the system, the system may be connected in a way that is different from the way illustrated in FIG. 2A.

Figure 3:
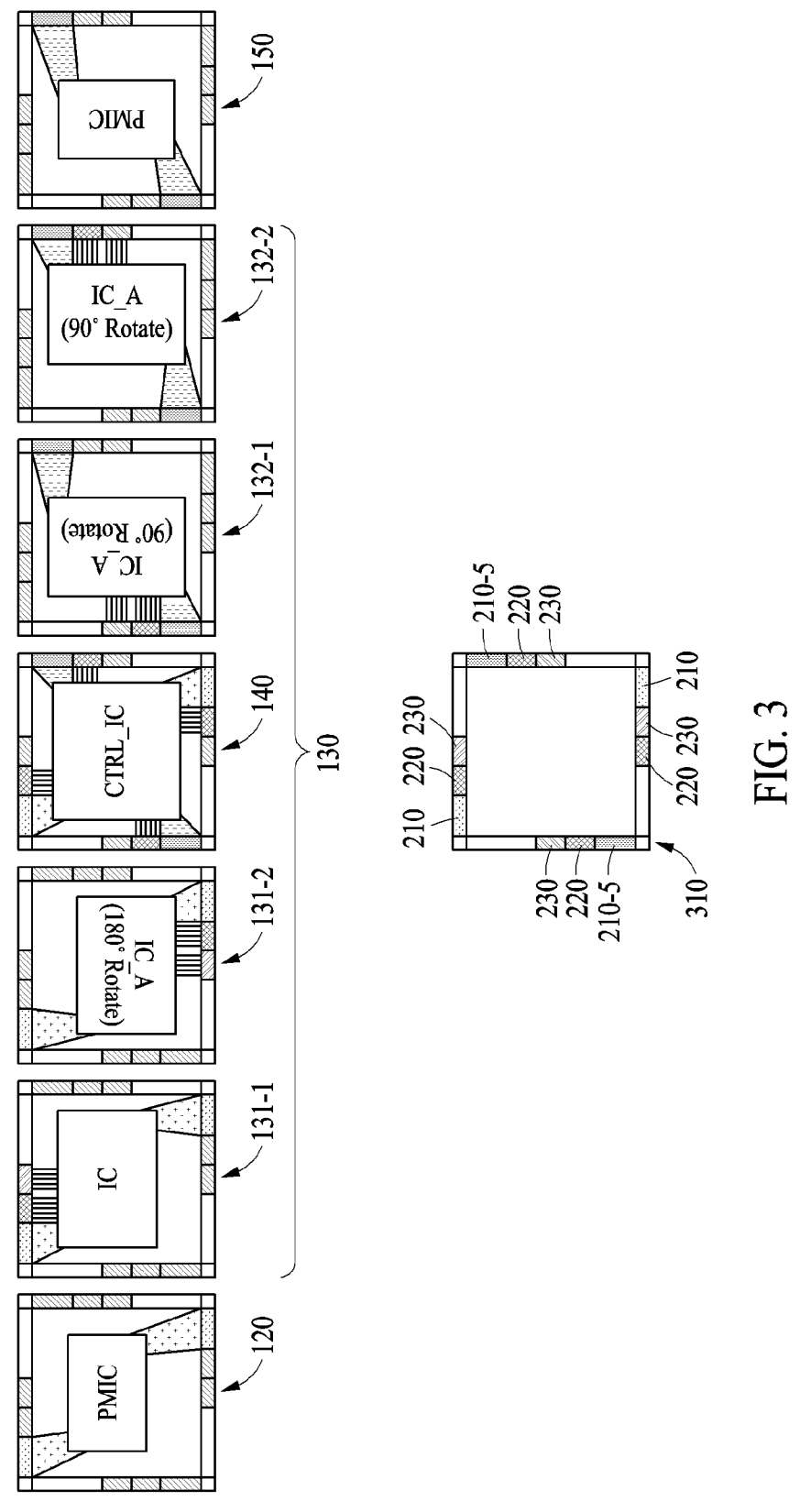
FIG. 3 illustrates an example stacked configuration of an IC system according to one or more embodiments.

FIG. 3 illustrates an example stacked configuration of an IC system according to one or more embodiments.

In a non-limiting example, FIG. 3 illustrates a stacked configuration between the first power managing IC chip 120, the IC chips 131-1, 131-2, 132-1, and 132-2, the control IC chip 140, and the second power managing IC chip 150 included in the IC system and an overall TSV use structure 310 according to the stacked configuration.

The IC chip 131-1 may be stacked in parallel to the first power managing IC chip 120.

The IC chip 131-2 may be rotated by a first preset angle (e.g., 180 degrees) and stacked such that identical components included in the IC chip 131-1 are in a relative positional relationship corresponding to an arrangement of the identical components that are rotated about a center of the IC chip 131-1 by the first preset angle.

The control IC chip 140 may be stacked by considering a connection relationship between the first power managing IC chip 120, the IC chip 131-1, and IC chip 131-2 and a TSV that transmits power, a central signal, and an independent signal.

The IC chip 132-1 may be rotated by a second preset angle (e.g., 90 degrees) from the position of the IC chip 131-2 and stacked such that the identical components included in the IC chip 131-1 are in a relative positional relationship corresponding to an arrangement of the identical components that are rotated counterclockwise about the center of the IC chip 131-1 by the second preset angle.

The IC chip 132-2 may rotated by the second preset angle (e.g., 90 degrees) in a different direction from the IC chip 131-2 and stacked such that the identical components included in the IC chip 131-1 are in a relative positional relationship corresponding to an arrangement of the identical components that are rotated clockwise about the center of the IC chip 131-1 by the second preset angle.

The second power managing IC chip 150 may be stacked by considering a connection relationship between the control IC chip 140, the IC chip 132-1, and the IC chip 132-2 and the TSV that transmits the power, the central signal, and the independent signal.

The aforementioned manner in which the first power managing IC chip 120, the IC chips 131-1, 131-2, 132-1 and 132-2, the control IC chip 140, the second power managing IC chip 150 are stacked may allow the power transmission TSV 210, the central signal transmission TSV 220, and the independent signal transmission TSV 230 to configure a structure, as illustrated by the structure 310, such that the structure may have a minimum area.

Figure 4:
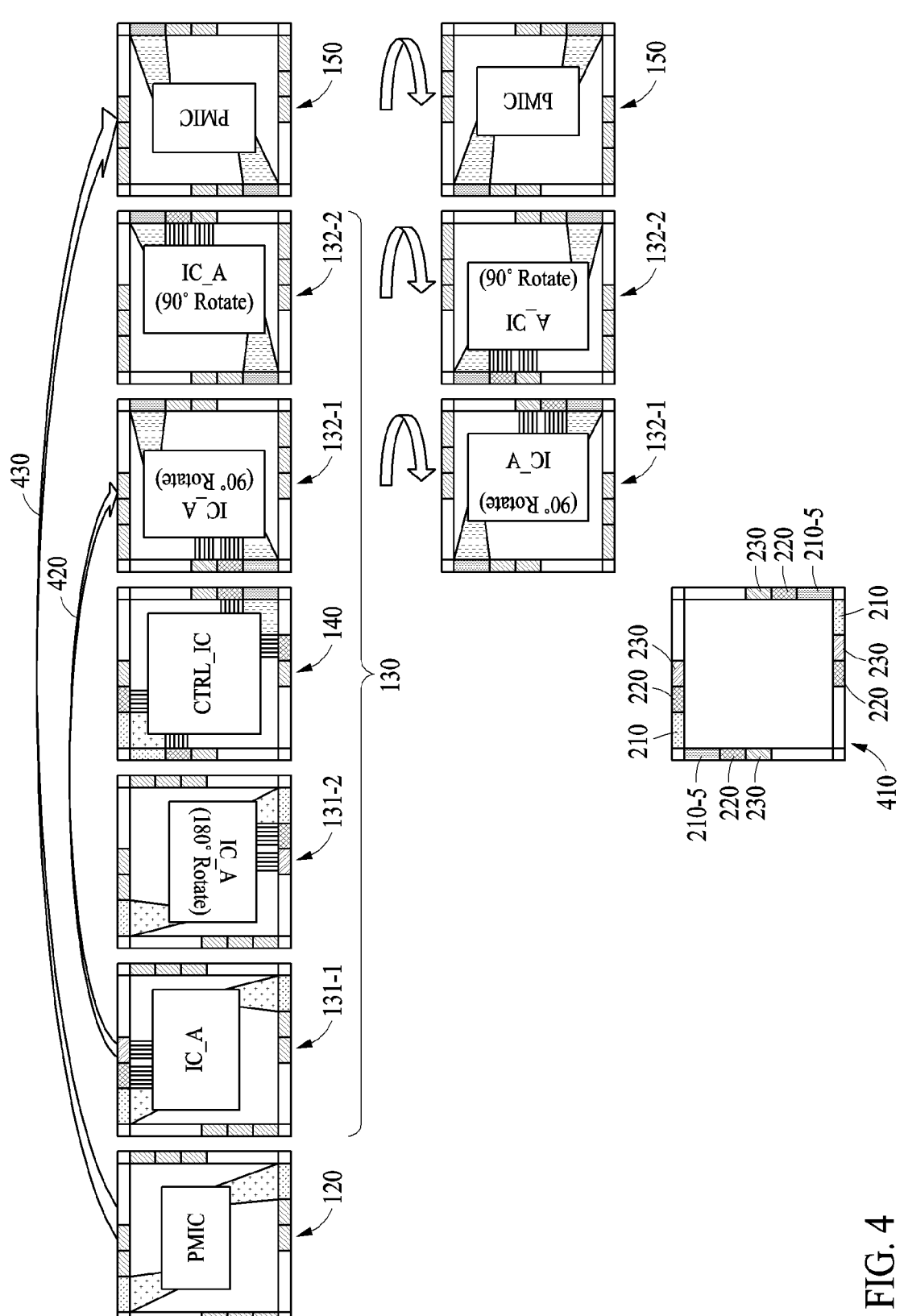
FIG. 4 illustrates an example stacked configuration of an IC system according to one or more embodiments.

FIG. 4 illustrates an example stacked configuration of an IC system according to one or more embodiments. In a non-limiting example, FIG. 4 illustrates a flip technique.

In a non-limiting example, the stacked configuration as illustrated in FIG. 3 may be differentiated by the example illustrated in FIG. 4 where FIG. 4 illustrates an example of a system that may be configured by flipping chips from left to right and then stacking the chips (i.e., a flip technique).

The IC chip 131-1 may be stacked in parallel to the first power managing IC chip 120.

The IC chip 131-2 may be rotated by a first preset angle (e.g., 180 degrees) and stacked such that identical components included in the IC chip 131-1 are in a relative positional relationship corresponding to an arrangement of the identical components that are rotated about a center of the IC chip 131-1 by the first preset angle.

The control IC chip 140 may be stacked by considering a connection relationship between the first power managing IC chip 120, the IC chip 131-1, and IC chip 131-2 and a TSV that transmits power, a central signal, and an independent signal.

The IC chip 132-1 may be rotated counterclockwise by a second preset angle (e.g., 90 degrees) such that the identical components included in the IC chip 131-1 are in a relative positional relationship corresponding to an arrangement of the identical components that are rotated counterclockwise about the center of the IC chip 131-1 by the second preset angle, and the IC chip 132-1 may be flipped from left to right and then stacked such that the identical components included in the IC chip 131-1 are in a relative positional relationship corresponding to an arrangement of the identical components that are flipped from left to right about the center of the IC chip 132-1 (i.e., as illustrated by arrow 420).

The IC chip 132-2 may be rotated counterclockwise by the second preset angle (e.g., 90 degrees) such that the identical components included in the IC chip 131-1 are in a relative positional relationship corresponding to an arrangement of the identical components that are rotated clockwise about the center of the IC chip 131-1 by the second preset angle, and the IC chip 132-1 may be flipped from left to right and then stacked such that the identical components included in the IC chip 131-1 are in a relative positional relationship corresponding to an arrangement of the identical components that are flipped from left to right about the center of the IC chip 132-1.

The second power managing IC chip 150 may be stacked by considering a connection relationship between the control IC chip 140, the IC chip 132-1, and the IC chip 132-2 and that the TSV that transmits the power, the central signal, and the independent signal (i.e., as illustrated by arrow 430).

The aforementioned manner in which the first power managing IC chip 120, the IC chips 131-1, 131-2, 132-1 and 132-2, the control IC chip 140, the second power managing IC chip 150 are stacked may allow the power transmission TSV 210, the central signal transmission TSV 220, and the independent signal transmission TSV 230 to form a structure, such as structure 410, where the structure 410 has a minimized area.

In the structure 410 of FIG. 4, a distance between the power transmission TSV 210 that transmits power to the IC chips 131-1 and 131-2 and a power transmission TSV 210-5 that transmits power to the IC chips 132-1 and 132-2 may be narrower than the distance found in the structure 310 of FIG. 3 (e.g., the distance from TSV 210 to TSV 210-5 in FIG. 3). When compared to the example of FIG. 3, the example of FIG. 4 may implement the power transmission TSV 210 that transmits the power to the IC chips 131-1 and 131-2 and the power transmission TSV 210-5 that transmits the power to the IC chips 132-1 and 132-2 through fewer holes that may be created during a process of manufacturing the system of structure 410. Accordingly, the system of FIG. 4 may be configured with fewer TSVs than the system of FIG. 3.

Figure 5A:
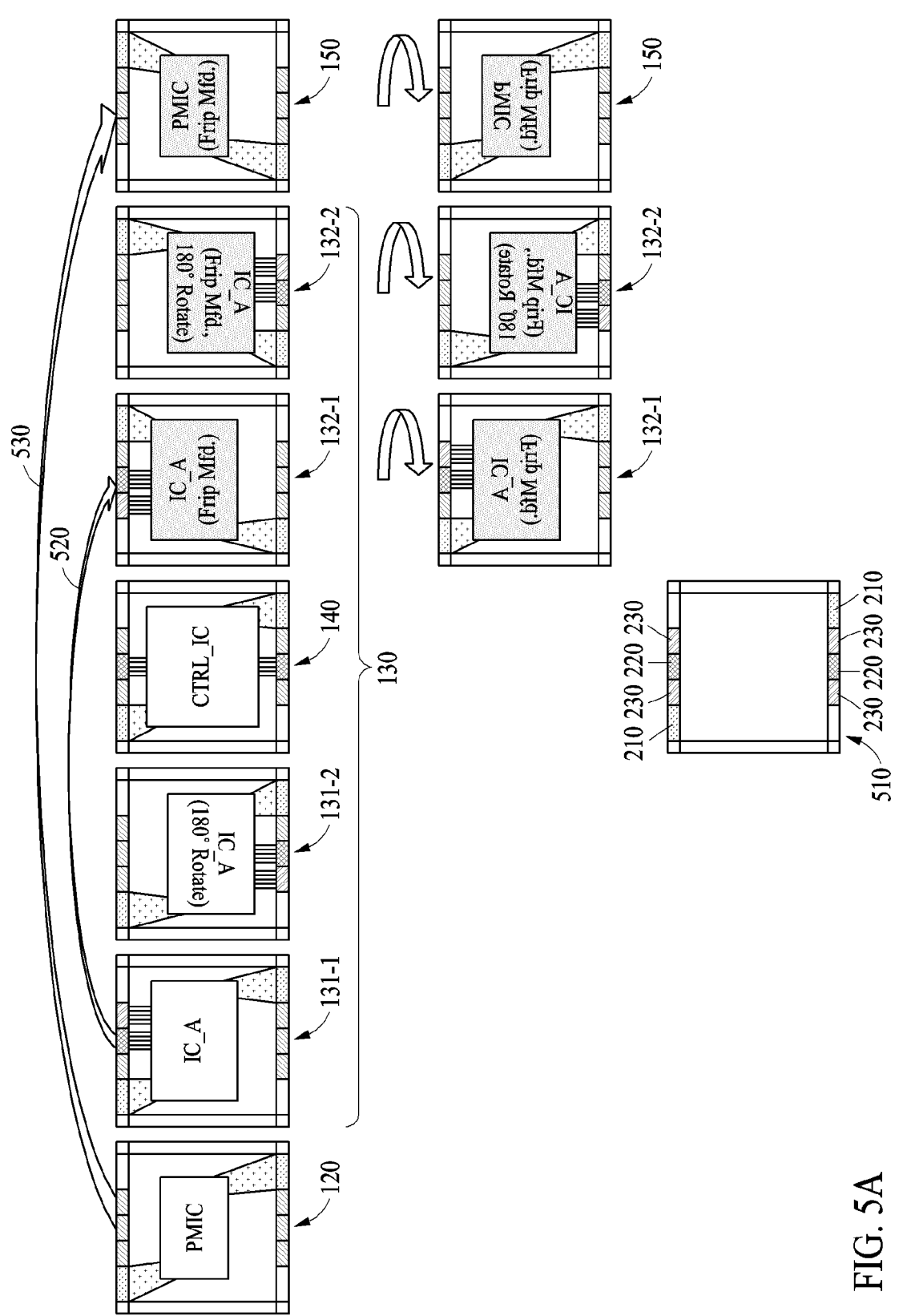
FIGS. 5A and 5B illustrate an example chip generation according to one or more embodiments.
Figure 5B:
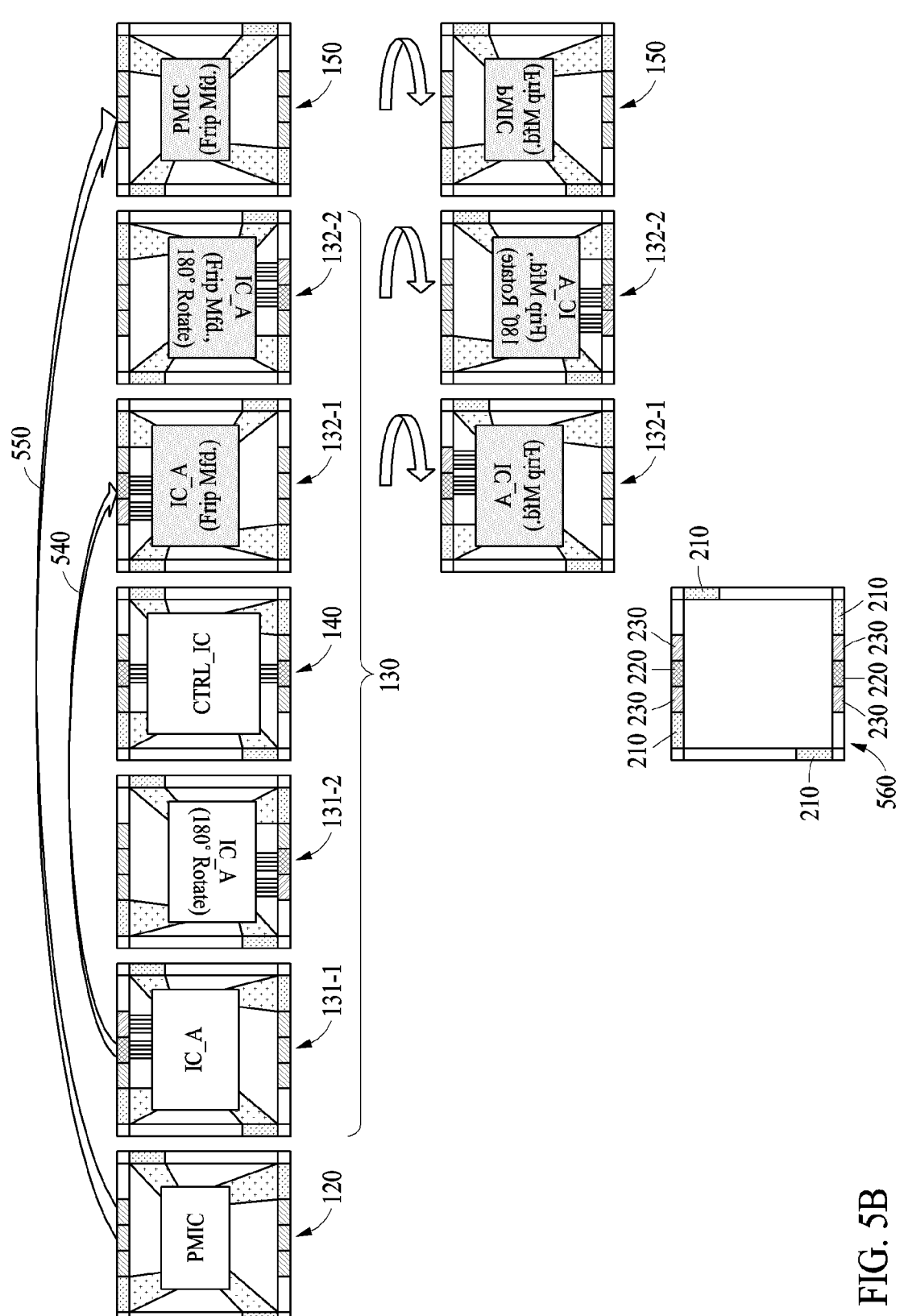

FIGS. 5A and 5B illustrate an example of chip generation according to one or more embodiments.

The example of FIG. 4 in which the system is configured by stacking chips that are flipped from left to right may also be applied in FIGS. 5A and 5B where FIGS. 5A and 5B illustrate examples of a system that may be configured using chips flipped from left to right and then manufactured and by flipping the chips (i.e., a flip technique).

Referring to FIG. 5A, the IC chip 131-1 may be stacked in parallel to the first power managing IC chip 120.

In a non-limiting example, the IC chip 131-2 may be rotated by a first preset angle (e.g., 180 degrees) and stacked such that identical components included in the IC chip 131-1 are in a relative positional relationship corresponding to an arrangement of the identical components that are rotated about a center of the IC chip 131-1 by the first preset angle.

The control IC chip 140 may be stacked by considering a connection relationship between the first power managing IC chip 120, the IC chip 131-1, and IC chip 131-2 and a TSV that transmits power, a central signal, and an independent signal.

The IC chip 132-1 may be flipped from left to right and then manufactured such that the identical components included in the IC chip 131-1 are in a relative positional relationship corresponding to an arrangement of the identical components that are flipped from left to right about the center of the IC chip 131-1 (i.e., as illustrated by arrow 520). Furthermore, the IC chip 132-1 may be flipped from left to right and stacked such that the identical components included in the IC chip 131-1 are in a relative positional relationship corresponding to an arrangement of the identical components that are flipped from left to right about the center of the IC chip 131-1.

The IC chip 132-2 may be flipped from left to right and manufactured such that the identical components included in the IC chip 131-1 are in a relative positional relationship corresponding to an arrangement of the identical components that are flipped from left to right about the center of the IC chip 131-1. The IC chip 132-2 may be rotated by the first preset angle (e.g., 180 degrees) such that the identical components included in the IC chip 131-1 are in a relative positional relationship corresponding to an arrangement of the identical components that are rotated about the center of the IC chip 131-1 by the first preset angle, and the IC chip 132-2 may be flipped from left to right and stacked such that the identical components included in the IC chip 131-1 are in a relative positional relationship corresponding to an arrangement of the identical components that are flipped from left to right about the center of the IC chip 132-2.

The second power managing IC chip 150 may be flipped from left to right and manufactured such that identical components included in the first power managing IC chip 120 are in a relative positional relationship corresponding to an arrangement of the identical components that are flipped from left to right about a center of the first power managing IC chip 120 (i.e., as illustrated by arrow 530). The second power managing IC chip 150 may be flipped from left to right and stacked such that the identical components included in the first power managing IC chip 120 are in a relative positional relationship corresponding to an arrangement of the identical components that are flipped from left to right about the center of the first power managing IC chip 120. The second power managing IC chip 150 may be stacked by considering a connection relationship between the control IC chip 140, the IC chip 132-1, and the IC chip 132-2 and the TSV that transmits the power, the central signal, and the independent signal.

The aforementioned manner in which the first power managing IC chip 120, the IC chips 131-1, 131-2, 132-1 and 132-2, the control IC chip 140, the second power managing IC chip 150 are stacked may allow the power transmission TSV 210, the central signal transmission TSV 220, and the independent signal transmission TSV 230 to be formed into a structure, like a structure 510, such that the structure has a minimum area.

FIG. 5A illustrates an example of using the IC chips 131-1 and 131-2 and the IC chips 132-1 and 132-2, which are flipped from left to right and then manufactured and using the first power managing IC chip 120 and the second power managing IC chip 150, which is flipped from left to right and manufactured, and flipping these chips once again to stack them. Compared to the examples illustrated in FIGS. 3 and 4, FIG. 5A illustrates the structure 510 showing that a system may be configured using only the power transmission TSV 210 and using fewer TSVs for the IC chips 131-1, 131-2, 132-1, and 132-2 and the control IC chip 140.

In a non-limiting example, FIG. 5B illustrates a configuration of a system that may reduce or minimize a number of TSVs while transmitting more power than the first power managing IC chip 120 and the second power managing IC chip 150 as illustrated in the example of FIG. 4.

The IC chip 131-1 may be stacked in parallel to the first power managing IC chip 120.

The IC chip 131-2 may be rotated by a first preset angle (e.g., 180 degrees) and stacked such that identical components included in the IC chip 131-1 are in a relative positional relationship corresponding to an arrangement of the identical components that are rotated about a center of the IC chip 131-1 by the first preset angle.

The control IC chip 140 may be stacked by considering a connection relationship between the first power managing IC chip 120, the IC chip 131-1, and IC chip 131-2 and a TSV that transmits power, a central signal, and an independent signal.

The IC chip 132-1 may be flipped from left to right and manufactured such that the identical components included in the IC chip 131-1 are in a relative positional relationship corresponding to an arrangement of the identical components that are flipped from left to right about the center of the IC chip 131-1 (i.e., as illustrated by arrow 530). Furthermore, the IC chip 132-1 may be flipped from left to right and stacked such that the identical components included in the IC chip 131-1 are in a relative positional relationship corresponding to an arrangement of the identical components that are flipped from left to right about the center of the IC chip 132-1.

The IC chip 132-2 may be flipped from left to right and manufactured such that the identical components included in the IC chip 131-1 are in a relative positional relationship corresponding to an arrangement of the identical components that are flipped from left to right about the center of the IC chip 131-1. The IC chip 132-2 may be rotated by the first preset angle (e.g., 180 degrees) such that the identical components included in the IC chip 131-1 are in a relative positional relationship corresponding to an arrangement of the identical components that are rotated about the center of the IC chip 131-1 by the first preset angle, and the IC chip 132-2 may be flipped from left to right and stacked such that the identical components included in the IC chip 131-1 are in a relative positional relationship corresponding to an arrangement of the identical components that are flipped from left to right about the center of the IC chip 132-2.

The second power managing IC chip 150 may be flipped from left to right and manufactured such that identical components included in the first power managing IC chip 120 are in a relative positional relationship corresponding to an arrangement of the identical components that are flipped from left to right about a center of the first power managing IC chip 120 (i.e., as illustrated by arrow 540). The second power managing IC chip 150 may be flipped from left to right and stacked such that the identical components included in the first power managing IC chip 120 are in a relative positional relationship corresponding to an arrangement of the identical components that are flipped from left to right about the center of the first power managing IC chip 120. The second power managing IC chip 150 may be stacked by considering a connection relationship between the control IC chip 140, the IC chip 132-1, and the IC chip 132-2 and the TSV that transmits the power, the central signal, and the independent signal.

The aforementioned manner in which the first power managing IC chip 120, the IC chips 131-1, 131-2, 132-1 and 132-2, the control IC chip 140, the second power managing IC chip 150 are stacked may allow the power transmission TSV 210, the central signal transmission TSV 220, and the independent signal transmission TSV 230 to configure a structure, like a structure 520, such that the structure has a minimum area.

FIG. 5B illustrates an example of using the IC chips 131-1 and 131-2 and the IC chips 132-1 and 132-2, which are flipped from left to right and manufactured, using the first power managing IC chip 120 and the second power managing IC chip 150, which is flipped from left to right and manufactured, and flipping these chips once again to stack them. Compared to the example of FIG. 4, the example of FIG. 5B illustrates a system including a structure 560 that may be configured using the same number of TSVs as the number of TSVs used in the example of FIG. 4 while the first power managing IC chip 120 may be able to transmit more power to the IC chips 131-1 and 131-2 and the second power managing IC chip 150 may be able to transmit more power to the IC chips 132-1 and 132-2. In an example, the structure 560 may provide multiple power transmission TSV 210 paths.

Figure 6:
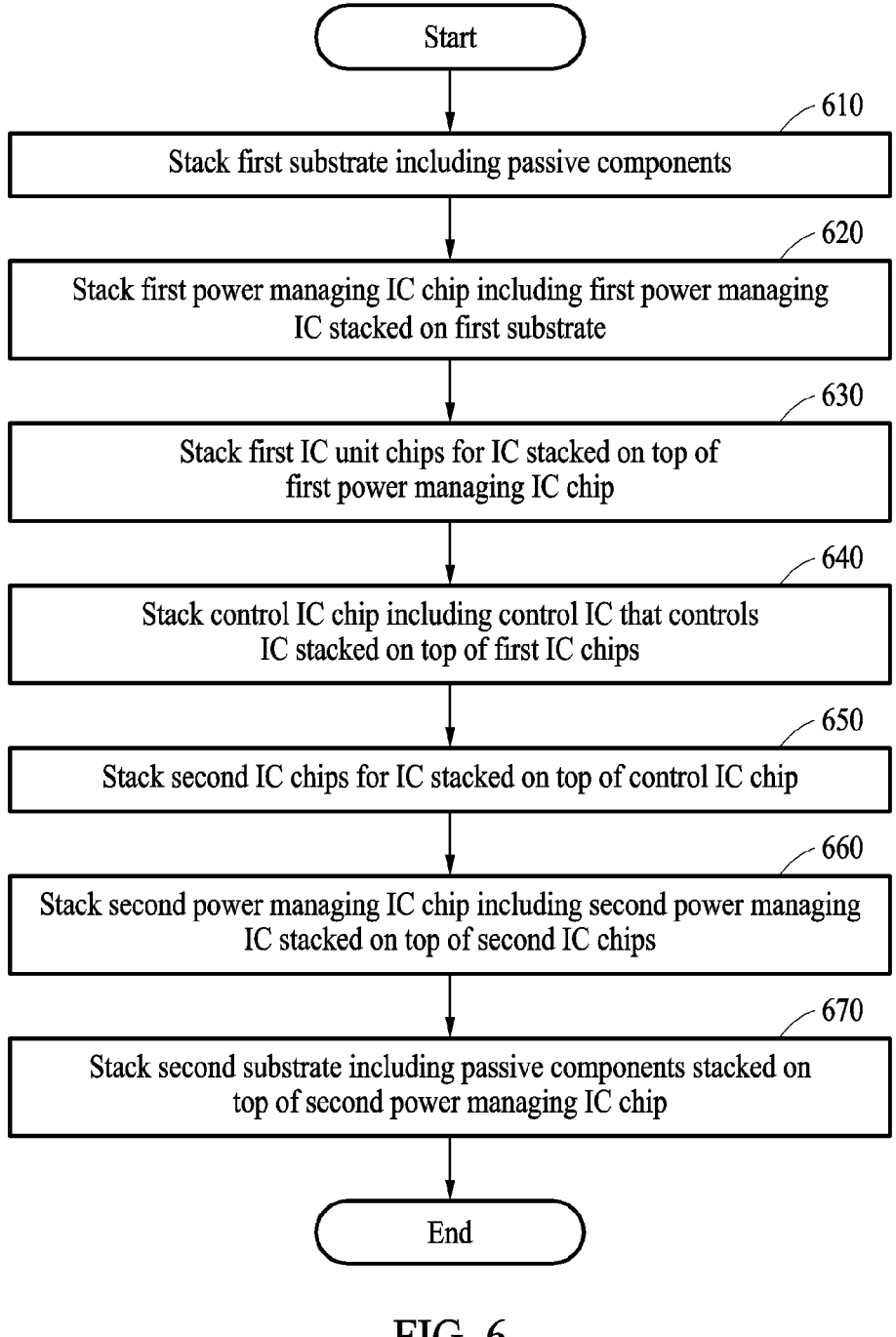
FIG. 6 illustrates an example method according to one or more embodiments.

FIG. 6 illustrates an example of a method according to one or more embodiments.

Although operations of FIG. 6 may be performed in the illustrated order and manner therein, the order of some of the operations may change or some of the operations may be omitted without departing from the spirit and scope of the illustrated example. The operations illustrated in FIG. 6 may be performed in parallel or simultaneously. As illustrated in FIG. 6, one or more blocks and a combination thereof may be implemented by a special-purpose hardware-based computer that performs a predetermined function, or a combination of computer instructions and special-purpose hardware. The description provided with reference to FIGS. 1 to 5B may apply to FIG. 6, and thus, any repeated description is omitted.

Referring to FIG. 6, in a non-limiting example, in operation 610, an IC manufacturing device may stack a first substrate including passive components. The first substrate may correspond to the first substrate 110 of FIG. 1.

In operation 620, the IC manufacturing device may stack a first power managing IC chip including a first power managing IC stacked on the first substrate. The first power managing IC chip may correspond to the first power managing IC chip 120 of FIG. 1.

In operation 630, the IC manufacturing device may stack a first IC chip group for an IC stacked on top of the first power managing IC chip. The first IC chip group may correspond to the first IC chip group 130-1 of FIG. 1 and may include the IC chips 131-1 and 131-2.

In operation 640, the IC manufacturing device may stack a control IC chip including a control IC that controls an IC portion (e.g., one or more IC chips) stacked on top of the first IC chip group. The control IC chip may correspond to the control IC chip 140 of FIG. 1.

In operation 650, the IC manufacturing device may stack a second IC chip group for an IC portion stacked on top of the control IC chip. The second IC chip group may correspond to the second IC chip group 130-2 of FIG. 1 and may include the IC chips 132-1 and 132-2.

In operation 660, the IC manufacturing device may stack a second power managing IC chip including a second power managing IC stacked on top of the second IC chip group. The second power managing IC chip may correspond to the second power managing IC chip 150 of FIG. 1.

In operation 670, the IC manufacturing device may stack a second substrate including passive components stacked on top of the second power managing IC chip. The second substrate may correspond to the second substrate 160 of FIG. 1.

Figure 7:
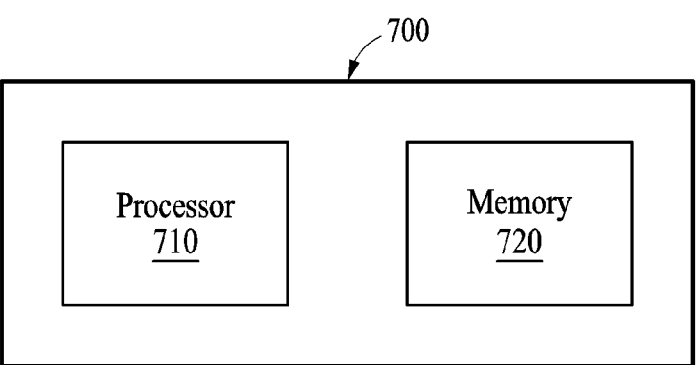
FIG. 7 illustrates an example electronic device (or system) with IC manufacturing process, in accordance with one or more embodiments.

FIG. 7 illustrates an example electronic device (or system) with IC manufacturing process according to one or more embodiments.

Referring to FIG. 7, an electronic device 700 may include at least one processor 710 and a memory 720. The description provided with reference to FIGS. 1 to 6 above may also be applied to FIG. 7. The examples may be implemented as various types of products, such as, for example, a personal computer (PC), a laptop computer, a tablet computer, a smartphone, a television (TV), a smart home appliance, an intelligent vehicle, a kiosk, and a wearable device.

The processor 710 may be configured to execute computer-readable instructions to configure the processor 710 to control the electronic device 700 to perform one or more or all operations and/or methods represented by the method of FIG. 6, and/or as described above in the arrangements described by the IC devices of FIGS. 1-5, and may include any one or a combination of two or more of, for example, a central processing unit (CPU), a graphic processing unit (GPU), and a neural processing unit (NPU), but is not limited to the above-described examples. The processor 710 may also execute programs or applications to control other functionalities of the electronic device. The processor 720 may be an SoC chip having the figuration of any of the 3D IC systems described herein.

The memory 720 may store computer-readable instructions. The processor 710 may be configured to execute computer-readable instructions, such as those stored in the memory 720, and through execution of the computer-readable instructions, the processor 710 is configured to perform one or more, or any combination, of the operations and/or methods described herein.

The memory 720 may be a volatile or nonvolatile memory. The memory 720 may include, for example, random-access memory (RAM), dynamic random-access memory (DRAM), static random-access memory (SRAM), or other types of non-volatile memory known in the art.

The electronic devices, IC devices, processors, memories, electronic device 700, processor 710, and memory 720 described herein and disclosed herein described with respect to FIGS. 1-7 are implemented by or representative of hardware components. As described above, or in addition to the descriptions above, examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. As described above, or in addition to the descriptions above, example hardware components may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-7 that perform the operations described in this application are performed by computing hardware, for example, by one or more processors or computers, implemented as described above implementing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media, and thus, not a signal per se. As described above, or in addition to the descriptions above, examples of a non-transitory computer-readable storage medium include one or more of any of read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and/or any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above and all drawing disclosures, the scope of the disclosure is also inclusive of the claims and their equivalents, i.e., all variations within the scope of the claims and their equivalents are to be construed as being included in the disclosure.

What is claimed is:

1. An integrated circuit (IC) system, comprising:
   a first substrate comprising passive components;
   a first power managing IC chip including a first power managing IC stacked on the first substrate;
   first IC chip group, including a IC, stacked on top of the first power managing IC chip;
   a control IC chip, stacked on top of the first IC group, including a control IC configured to control the first IC and a second IC of a second IC chip group;
   the second IC chip group, including the second IC, stacked on top of the control IC chip;
   a second power managing IC chip including a second power managing IC stacked on top of the second IC chip group; and
   a second substrate comprising passive components stacked on top of the second power managing IC chip.

2. The IC system of claim 1, wherein the first IC chip group including the first IC comprises:
   a first IC chip; and
   a second IC chip stacked on top of the first IC chip, and
   wherein the second IC chip group including the second IC comprises:
   a third IC chip; and
   a fourth IC chip stacked on top of the third IC chip.

3. The IC system of claim 2, wherein the second IC chip is stacked on the first IC chip such that second components of the second IC chip, identical to first components of the first IC chip, are in a relative positional relationship corresponding to an arrangement of the first components but rotated, in a same lateral plane, about a center of the first IC chip by a first preset angle.

4. The IC system of claim 2, wherein the third IC chip is stacked above the first IC chip such that third components of the third IC chip, identical to first components of the first IC chip, are in a relative positional relationship corresponding to an arrangement of the first components but rotated, in a same lateral plane, counterclockwise about a center of the first IC chip by a second preset angle.

5. The IC system of claim 2, wherein the fourth IC chip is stacked above the first IC chip such that fourth components of the fourth IC chip, identical to first components of the first IC chip, are in a relative positional relationship corresponding to an arrangement of the first components but rotated, in a same lateral plane, clockwise about a center of the first IC chip by a second preset angle.

6. The IC system of claim 2, wherein the second power managing IC chip is stacked on top of the second IC chip group is arranged such that fifth components of the second power managing IC, identical to components of the first power managing IC of the first power managing IC chip, are in a relative positional relationship corresponding to an arrangement of the components of the first power managing IC but rotated, in a same lateral plane, counterclockwise about a center of the first power managing IC chip by a second preset angle.

7. The IC system of claim 2, wherein the third IC chip is stacked above the first IC chip, having an upside arrangement, such that third components of the third IC chip, identical to first components of the first IC chip, are in a relative positional arrangement corresponding to an arrangement of the first components but rotated, in a same lateral plane, counterclockwise about a center of the first IC unit chip by a second preset angle, and then rotationally flipped upside-down, from left to right, about a center of the third IC chip relative to the upside arrangement of the first IC chip.

8. The IC system of claim 2, wherein the fourth IC chip is stacked above the first IC chip, having an upside arrangement, such that fourth components of the fourth IC chip, identical to first components of the first IC chip, are in a relative positional arrangement corresponding to an arrangement of the first components but rotated, in a same lateral plane, clockwise about a center of the first IC chip by a second preset angle, and then rotationally flipped upside-down, from left to right, about a center of the fourth IC chip relative to the upside arrangement of the first IC chip.

9. The IC system of claim 7, wherein the second power managing IC chip is stacked above the first power managing IC chip, having an upside arrangement, and arranged such that sixth components of the second power managing IC, identical to components of the first power managing IC of the first power managing IC chip, are in a relative positional arrangement corresponding to an arrangement of the components of the first power managing IC but rotated, in a same lateral plane, counterclockwise about a center of the first power managing IC chip by a second preset angle, and then rotationally flipped upside-down, from left to right, about a center of the second power managing IC chip relative to the upside arrangement of the first power managing IC chip.

10. The IC system of claim 2, wherein the third IC chip is stacked above the first IC chip, having an upside arrangement, such that third components of the third IC chip, identical to first components of the first IC chip, are in a relative positional arrangement corresponding to an arrangement of the first components but rotationally flipped upside-down, from left to right, about a center of the third IC chip relative to the upside arrangement of the first IC chip.

11. The IC system of claim 10, wherein the second power managing IC chip is stacked above the first power managing IC chip, having an upside arrangement, such that fifth components of the second power managing IC chip, identical to components of the first power managing IC chip, are in a relative positional arrangement corresponding to an arrangement of the components but rotationally flipped upside-down, from left to right, about a center of the second power managing IC chip relative to the upside arrangement of the first power managing IC chip.

12. The IC system of claim 10, wherein the first power managing IC chip further comprises a plurality of interconnects to the second IC chip group, wherein the second power managing IC chip is stacked above the first power managing IC chip, having an upside arrangement, such that fifth components of the second power managing IC chip, identical to first components of the first power managing IC chip, are in a relative positional arrangement corresponding to an arrangement of the first components but rotationally flipped upside-down, from left to right, about a center of the second power managing IC chip relative to the upside arrangement of the first power managing IC chip.

13. The IC system of claim 2, wherein the fourth IC chip is stacked above the first IC chip, having an upside arrangement, such that fourth components of the fourth IC chip, identical to first components of the first IC chip, are in a relative positional arrangement corresponding to an arrangement of the first components but rotationally flipped upside down, right to left, about a center of the fourth IC chip, and then rotated, in a same lateral plane, by a first preset angle, about a center of the fourth IC chip.

14. The IC system of claim 1, wherein the first power managing IC chip and the second power managing IC chip comprise a plurality of capacitors and a plurality of inductors.

15. The IC system of claim 1, wherein the first power managing IC chip is different from the second power managing IC chip.

16. The IC system of claim 1, wherein IC chips of the first IC chip group and the second IC chip group are identical.

17. The IC system of claim 1, further comprising:

a plurality of interconnects configured to electrically connect circuits of the first power managing IC chip, the first IC chip group, the control IC chip, the second IC chip group, and the second power managing IC chip to the first substrate and the second substrate, wherein a number of the plurality of interconnects is determined based on a total number of IC chips of the first IC chip group and the second IC chip group.

\* \* \* \* \*